(12) United States Patent
Holsomback

(10) Patent No.: US 8,547,109 B2
(45) Date of Patent: Oct. 1, 2013

(54) CAPACITOR MONITORING SYSTEMS AND METHODS OF METERING AND MONITORING CAPACITOR BANK

(75) Inventor: Van L. Holsomback, Marietta, GA (US)

(73) Assignee: The Southern Company, Atlanta, GA (US)

( * ) Notice: Subject to any disclaimer, the term of this patent is extended or adjusted under 35 U.S.C. 154(b) by 279 days.

(21) Appl. No.: 13/185,542

(22) Filed: Jul. 19, 2011

(65) Prior Publication Data

US 2012/0013347 A1    Jan. 19, 2012

Related U.S. Application Data

(60) Provisional application No. 61/365,579, filed on Jul. 19, 2010.

(51) Int. Cl.
*G01R 31/12* (2006.01)

(52) U.S. Cl.
USPC ......................................................... 324/548

(58) Field of Classification Search
USPC ........................... 324/548, 658, 76.11
See application file for complete search history.

(56) References Cited

U.S. PATENT DOCUMENTS

| | | | | |
|---|---|---|---|---|
| 7,667,353 | B2 * | 2/2010 | Coolidge et al. | 307/127 |
| 2011/0241695 | A1 * | 10/2011 | Younsi et al. | 324/548 |

* cited by examiner

*Primary Examiner* — Vincent Q Nguyen
(74) *Attorney, Agent, or Firm* — Dustin B. Weeks, Esq.; Ryan A. Schneider, Esq.; Troutman Sanders LLP

(57) ABSTRACT

The present invention relates to a capacitor bank monitoring system for monitoring the status of a capacitor bank in a power distribution system. The capacitor bank monitoring system includes a current transformer, a metering connection, and a housing for an electric utility meter. The current transformer is in electrical communication with a neutral terminal of the distribution system and can measure the current carried by the neutral terminal. The meter connection subsystem can provide electrical communication between the electric utility meter and the current transformer, such that the electric utility meter communicates the status of the capacitor bank.

21 Claims, 4 Drawing Sheets

CAPACITOR MONITORING SYSTEMS AND METHODS OF METERING AND MONITORING CAPACITOR BANK

CROSS-REFERENCE TO RELATED APPLICATIONS

This application claims the benefit of U.S. Provisional Application Ser. No. 61/365,579, filed 19 Jul. 2010, which is incorporated herein by reference in its entirety as if fully set forth below.

TECHNICAL FIELD OF THE INVENTION

The various embodiments of the present disclosure relate generally to monitoring systems and methods. More particularly, the various embodiments of the present invention are directed to systems and methods for monitoring a capacitor bank in a power distribution system.

BACKGROUND OF THE INVENTION

Generally, banks of capacitors can be switched in and out of three phase power distribution systems for voltage and power factor correction purposes and the like. Capacitor banks typically comprise a fuse and a capacitor for each phase. Additionally, some capacitor banks further comprise a switching element. In one configuration, the three capacitors are connected in a shunt or "wye" configuration with a common neutral/ground terminal.

Unfortunately a power utility company does not have information regarding the operational health of the capacitor bank components. To date, the status of each capacitor bank is gathered, if at all, locally by field crews that periodically manually inspect the components of the capacitor banks by driving by each power pole and glancing upwardly toward the capacitor bank. Such drive-by inspections do not determine the status of the capacitor bank, as the only thing the inspector can see is if a cutout or fuse has blown.

BRIEF SUMMARY OF THE INVENTION

Briefly described, embodiments of the present invention relate to a system for remote and automated monitoring of a power distribution system. A power distribution system can include a capacitor bank for regulating the voltage on the load ends of the distribution system. An exemplary capacitor bank includes at least one capacitor in serial electrical communication with a fuse element. The capacitor bank can also be in electrical communication with a neutral terminal of the power distribution system. An exemplary embodiment of the present invention provides a capacitor bank monitoring system for monitoring a status (for example, measuring current which can be indicative of health) of a capacitor bank in an electrical power distribution system. The system comprises a housing for an electric utility meter, a current transformer, and a meter connection subsystem. The current transformer is located in proximity to the housing and measures the current carried by the neutral terminal, which is indicative of the status of the capacitor bank. The meter connection subsystem provides electrical communication between the current transformer and the electric utility meter. The electric utility meter communicates the status of the capacitor bank to the utility.

In an exemplary embodiment of the present invention, the electric utility meter communicates the status of the capacitor bank to a central station via an Advanced Meter Infrastructure ("AMI") system. In another exemplary embodiment of the present invention, the meter connection subsystem comprises a plurality of conductive receiving elements that receive apertures of the electric utility meter. In yet another exemplary embodiment of the present invention, the housing comprises a securing element for securing the capacitor bank monitoring system to a support structure, such as a utility pole. In still another exemplary embodiment of the present invention, the securing element is a non-boring securing element securing the capacitor bank monitoring system to the support structure without boring into the support structure.

In some embodiments of the present invention, the capacitor bank further includes a switching element in serial electrical communication with the capacitor and the fuse element. Thus, in some embodiments of the present invention, the electric utility meter is an automated reconnect/disconnect utility meter that actuates, e.g. opens or closes, the switching element of the capacitor bank upon reception of a control signal. Some embodiments of the present invention further comprise an auxiliary control circuit panel in electrical communication with the automated reconnect/disconnect utility meter for controlling at least a portion of the capacitor bank, such as the switching element.

In addition to capacitor bank monitoring systems, the present invention also relates to methods of monitoring the status of a capacitor bank. An exemplary embodiment of the present invention provides a method of monitoring the status of a capacitor bank in a power distribution system, comprising: placing a capacitor bank monitoring system adjacent the neutral terminal; reading a current from a current transformer with an electric utility meter, wherein the electric utility meter is in communication with an AMI system; and communicating the reading using the AMI system. In another exemplary embodiment of the present invention, the method further comprises using the electric utility meter to actuate a switching element of the capacitor bank upon reception of a control signal.

Various embodiments of the present invention can eliminate the periodic and expensive need for linemen to manually and visually check each capacitor bank to determine its performance. Instead, by communicating the status of the capacitor bank to a central station, the capacitor monitoring system can provide an automatic indication that a capacitor requires maintenance. In addition, the system permits a utility to use preselected meters (e.g., its own conventional utility meters used to monitor power usage by a customer) to monitor and measure the status of a capacitor bank, and hence eliminates the need of the utility to purchase a separate and typically expensive monitoring system to monitor the power distribution system.

These and other aspects of the present invention are described in the Detailed Description of the Invention below and the accompanying figures. Other aspects and features of embodiments of the present invention will become apparent to those of ordinary skill in the art, upon reviewing the following description of specific, exemplary embodiments of the present invention in concert with the figures. While features of the present invention may be discussed relative to certain embodiments and figures, all embodiments of the present invention can include one or more of the features discussed herein. While one or more embodiments may be discussed as having certain advantageous features, one or more of such features may also be used with the various embodiments of the invention discussed herein. In similar fashion, while exemplary embodiments may be discussed below as system or method embodiments, it is to be understood that such exemplary embodiments can be implemented in various devices, systems, and methods of the present invention.

BRIEF DESCRIPTION OF THE DRAWINGS

The following Detailed Description of the Invention is better understood when read in conjunction with the appended drawings. For the purposes of illustration, there is shown in the drawings exemplary embodiments, but the subject matter is not limited to the specific elements and instrumentalities disclosed.

DETAILED DESCRIPTION OF THE INVENTION

To facilitate an understanding of the principles and features of embodiments of the invention, they are explained hereinafter with reference to their implementation in an illustrative embodiment. Generally, embodiments of the present invention are described in the context of being monitoring systems and methods. More particularly, embodiments of the present invention are described in the context of being systems and methods for monitoring the status of a capacitor bank of a electric power distribution system.

Embodiments of the present invention, however, are not limited to use in the described systems. Rather, embodiments of the present invention can be used when a monitoring system is desired or necessary. Thus, the system described hereinafter as a system for monitoring and/or metering a capacitor bank can also find utility as a system for other applications, beyond that of capacitor banks.

Additionally, the materials and components described hereinafter as making up the various elements of the monitoring systems are intended to be illustrative and not restrictive. Many suitable materials and components that would perform the same or a similar function as the materials and components described herein are intended to be embraced within the scope of the invention. Such other materials and components not described herein can include, but are not limited to, for example, materials and/or components that are developed after the time of the development of embodiments of the present invention.

Figure 1:
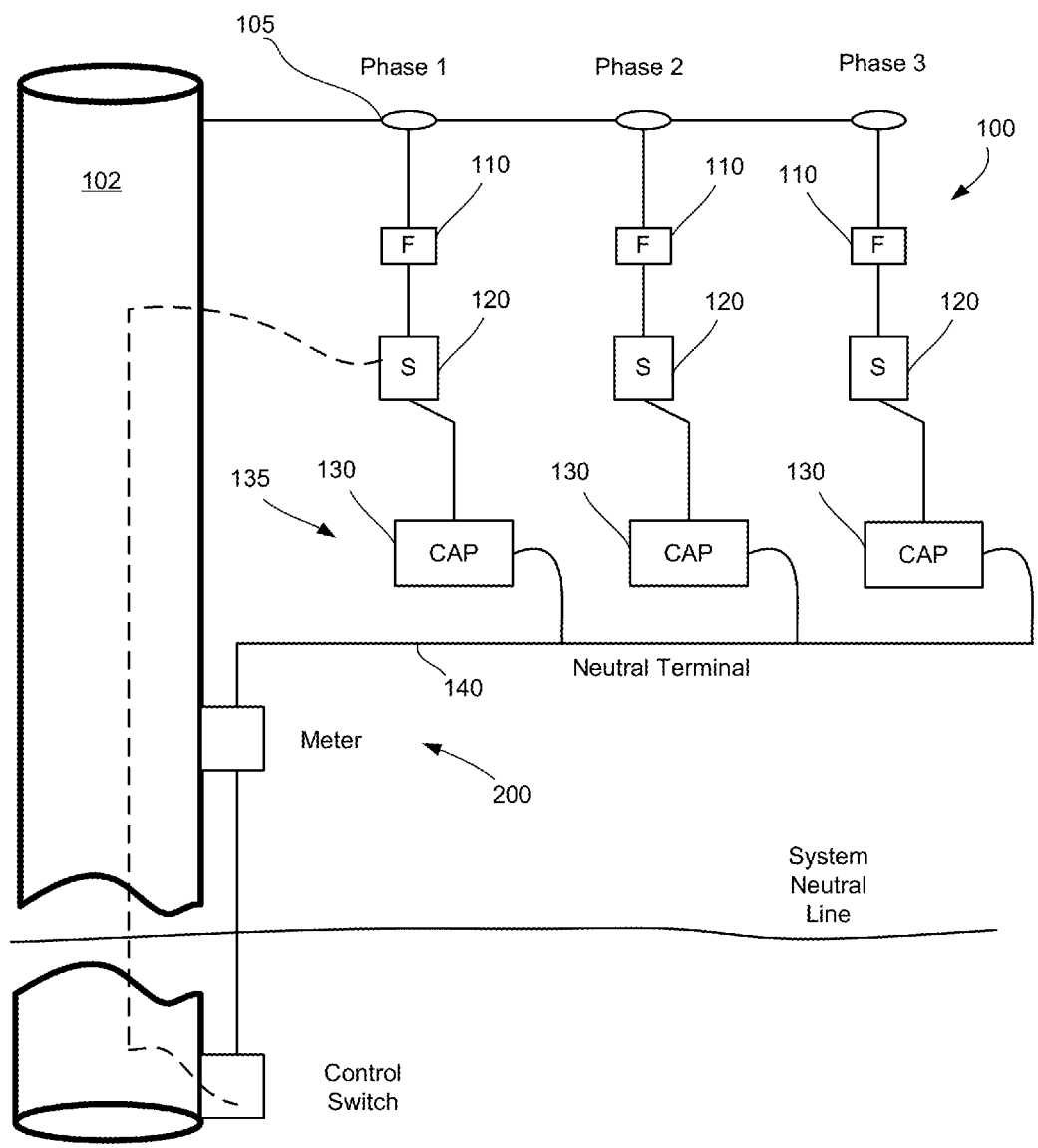
FIG. 1 illustrates an environmental view of a capacitor monitoring system in communication with a power pole, in accordance with an exemplary embodiment of the present invention.

Referring now to the figures, wherein like reference numerals represent like parts throughout the views, embodiments of the present invention will be described in detail. FIG. 1 illustrates an environmental view of a monitoring system 200, in accordance with exemplary embodiments of the present invention. The monitoring system 200 is configured to monitor and meter the status of elements of a power distribution system 100. For example, some embodiments of the present invention are configured to monitor and meter the status of a capacitor bank in a power distribution system.

An exemplary power distribution system 100 can include a wye configuration of three phase power. Each phase of the power distribution system 100 can include a capacitor bank 135 comprising a fuse element 110 and a capacitor 130. The fuse element 110 and capacitor 130 can be in serial electrical communication with one another. In some embodiments of the present invention, the capacitor bank 135 further comprises a switching element 120 in serial electrical communication with the fuse element 110 and the capacitor 130. Each conductor 105 of the three phase system of the power distribution system 100 can be carried by a support structure, such as a power pole 102.

The power conductor 105 can be in electrical communication with a fuse 110. The fuse 110 can be configured to blow upon a spike or drop in voltage or current. In some embodiments, the fuse 110 can be a cutout. For example and not limitation, the cutout can be an open fuse cutout for reliable protection from a lightning surge to prevent unwanted accidents, which would otherwise result from a lightning surge. A purpose of a fuse cutout is to provide protection for power distribution systems and the various components on those power lines, such as transformers and capacitor banks. An over current in the system can occur under various conditions, such as an animal or tree contacting the power lines or more than one power line contacting each other. The fuse cutout acts to interrupt the current, and then the fuseholder of the cutout "drops out," thereby preventing the voltage from being impressed across the fuseholder and providing a visual indication of operation to the utility line crew.

A switching element 120 can be in electrical communication with the fuse element 110, or cutout. In an exemplary embodiment of the present invention, the switching element 120 is in serial electrical communication with the fuse element 110. The switching element 120 can have an open position and a closed position. In some embodiments of the present invention, when in an open position, current does not flow through the switching element 120. On the other hand, in some embodiments of the present invention, when in the closed position, the switching element 120 permits current to flow therethrough. By having the ability open and close the switching element 120, a lineman has the ability to access the capacitor safely, particularly when the switching element 120 is in the open state.

A capacitor 130 can be in electrical communication with the switching element 120. In an exemplary embodiment of the present invention, the capacitor 130 is a power capacitor. In some exemplary embodiments of the present invention, the capacitor 130 is in serial electrical communication with the switching element 120. The capacitor 130 can be used to control voltages supplied to the customer by eliminating the voltage drop in the system caused by inductive reactive loads. In some embodiments, the capacitors 130 have a low loss, all-film, double bushing design with ANSI gray stainless steel tanks. The capacitors 130, as shown in FIG. 1, are connected in a wye configuration for optional grounding by a customer. The capacitors 130 can produce rated KVAR at a rated voltage and frequency. The capacitors 130 typically comply with all applicable NEMA and ANSI/IEEE standards. Internal discharge resistors can reduce residual voltage in capacitors 130 to approximately less than 50 volts within five minutes of de-energization. The capacitor 130 can have a dielectric fluid that can be environmentally friendly, biodegradable, non-PCB with low toxicity.

Each capacitor 130 in the capacitor bank 135 can be coupled to a neutral terminal 140. The neutral terminal 140 carries both voltage and current. In some embodiments of the present invention, by monitoring the neutral terminal 140, the status of the capacitor bank 135 can be determined. Thus, some embodiments of the present invention monitor the neutral terminal 140 from the capacitor bank 135. In addition, embodiments of the present invention are adapted to monitor and remotely communicate the status of the capacitor bank 135 via standard and conventional means, such as AMI and the like.

Figure 2A:
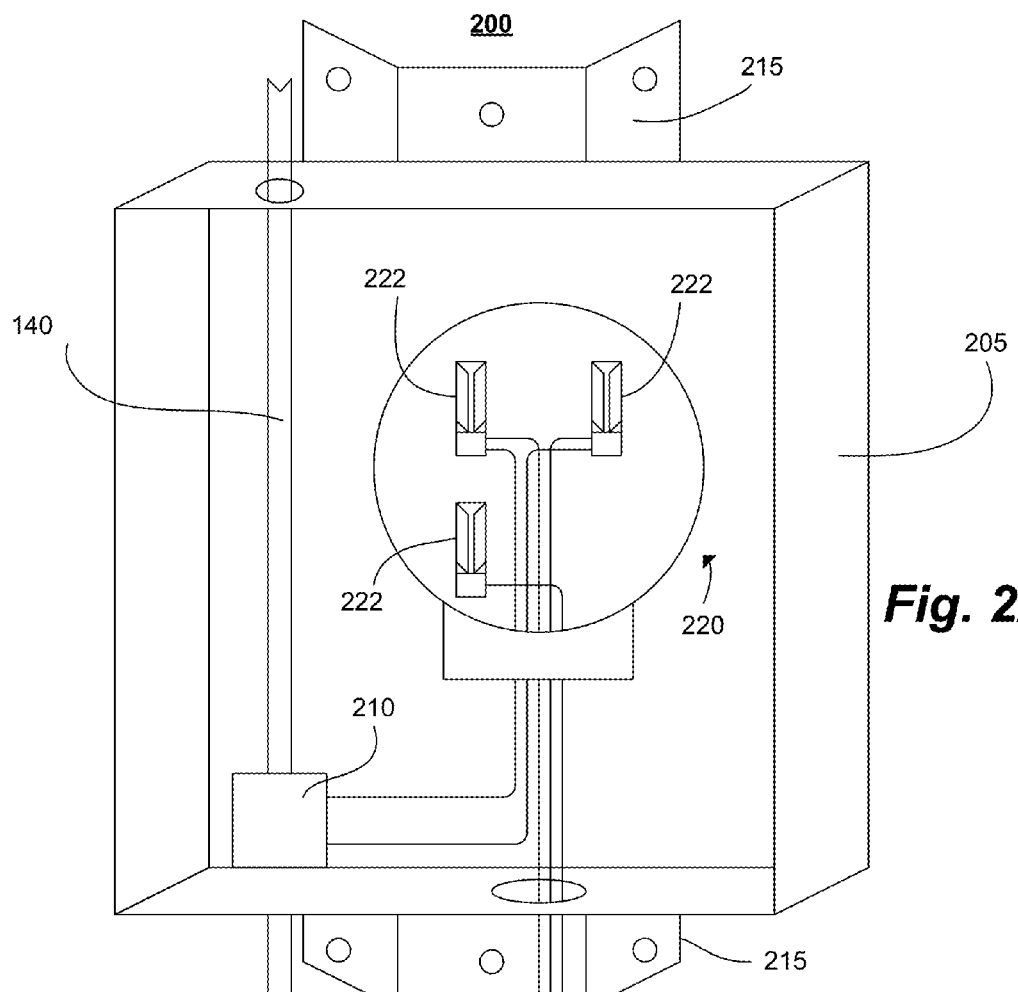
FIG. 2A illustrates a perspective view of a capacitor monitoring system, in accordance with an exemplary embodiment of the present invention.
Figure 2B:
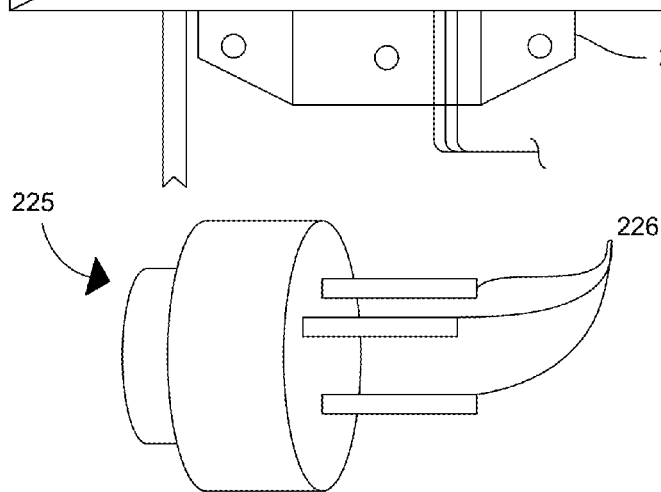
FIG. 2B illustrates a perspective view of a electric utility meter, in accordance with an exemplary embodiment of the present invention.

As generally illustrated in FIG. 2, an exemplary embodiment of the present invention provides a capacitor bank monitoring system 200 comprising a housing 205, a current transformer 210, and a meter connection subsystem 220. The monitoring system 200 is configured to monitor a capacitor bank 135 to determine the health and status of the capacitors 130 and other components in the capacitor bank 135. The monitoring system 200 is further configured to communicate the health and/or status of the capacitors 130 in the capacitor bank 135. For example, in an exemplary embodiment of the present invention, the monitoring system 200 is configured to communicate the health and/or status of the capacitor bank 135 to a central station. In an exemplary embodiment of the present invention, the central station can be the control station used by an electric utility to monitor electric utility meters. In another embodiment of the present invention, the central station can be the power distribution control center for an electric utility.

In an exemplary embodiment of the present invention, the housing 205 can be sized to partially or completely receive and secure a conventional electric utility meter 225. In some embodiments of the present invention, the housing 205 is secured to the support structure, e.g., a power pole 102, via a securing means 215. The securing means 215 can include either a boring or non-boring system, such as a nut/bolt combination or an adhesive means. As used herein, non-boring means that the holes are not bored into the support structure in order to secure the housing to the support structure. As shown in FIG. 2, a mounting bracket can provide the means to secure the housing and other elements of the monitoring system 200 to the support structure.

In some embodiments of the present invention, the current transformer 210 can be positioned about the housing 205. In some embodiments of the present invention, the current transformer 210 can be disposed within the housing 205. In another embodiment, the current transformer 210 can be placed outside the housing 205. The current transformer 210 can be in electrical communication with the neutral terminal 140. In some embodiments, the current transformer 210 is a 100/5 A current transformer. As those skilled in the art will understand, current transformers 210 can be used for measurement of electrical currents. The current transformer 210 can produce a reduced current accurately proportional to the current on the neutral terminal 140, which can be measured by the metering device 225 that is in electrical communication. For example, the current transformer 210 can be positioned such that the current and voltage in the neutral terminal produces a voltage and current in the current transformer, which can be measured by an utility meter 225.

In essence, the current transformer 210 can act as the probe to read the current on the neutral terminal 140, while the metering device 225 interprets the reading and can transmit the reading onward for use by the utility. For example, if the capacitor bank 135 is in good health, the reading can be about 1-2 A. The capacitor bank 135 is in poor health, or the fuse 110 may have blown, if the reading can be about 20-40 A. As those of ordinary skill in the art understand, by reading the current on the neutral terminal 140, the status and/or health of the capacitors can be determined.

In some embodiments of the present invention, the meter connection subsystem 220 is positioned to provide electrical communication between the current transformer 210 and a utility meter 225. Thus, the utility meter can measure the current from the current transformer 210. The meter connection subsystem 220 can be disposed within the housing 205. In some embodiments of the present invention, the meter connection subsystem is configured to receive a utility meter 225. For example, in some embodiments of the present invention, the meter connection subsystem 220 comprises a plurality of conductive receiving elements 222 sized and shaped to receive apertures or outwardly extending plug members 226 of the meter 225. The plug members 226 can be inserted into the conductive receiving elements 222, or outlet, of the meter connection subsystem 220.

The meter connection subsystem 220 can be configured such that many metering devices 225 can be plugged into the meter connection subsystem 220. In an exemplary embodiment of the present invention, the meter connection subsystem can receive a conventional utility meter that operates with and AMI system. AMI is a form of automatic meter regarding (AMR). AMR is the technology of automatically collecting consumption, diagnostic, and status data from, for example, energy metering devices and transferring that data to a central database or central station for billing, troubleshooting, and analyzing. AMI and AMR systems can provide one or two-way communication between a meter and a central stations. The communication can be via many methods known to those skilled in the art, including, but not limited to, broadband over power line, power linc communications, fixed radio frequency networks, public networks (e.g. lanline, cellular, and paging), and the like. AMI and AMR systems can save a utility provider the expense of periodic trips to each physical location to read a meter 225, or, for example, in the present case, from having linemen drive the lines to determine the status and health of a capacitor 135. This timely information coupled with analysis, can help both utility providers and customers better control the use and production of utility consumption.

An advantage of the present monitoring system 200 over conventional capacitor bank monitoring systems is that the meter connection subsystem 220 allows a utility, or other user, to use its own standard meter 225 to read the current from the current transformer 210. Further, when those meters are AMI meters configured to communicate with a central station via the utility's existing AMI system, there is no need for the utility to purchase and implement a specific monitoring system with a separate communication infrastructure; thus, embodiments of the present invention allow for decreases in cost and increases in efficiency of the process of monitoring a capacitor bank 135 over conventional systems.

While some conventional monitoring systems are capable of monitoring switched capacitor banks by monitoring the switching system, fixed capacitor systems cannot be monitored, and thus, conventionally, are not being monitored. In some embodiments of the present invention, however, the monitoring system 200 is configured to monitor not only switching capacitor banks, but also fixed capacitor banks.

In some embodiments of the present invention, the monitoring system 200 can further include a self grounding mechanism. The grounding mechanism can be many grounding mechanisms known in the art. The self grounding mechanism grounds the monitoring system 200 in the event of a surge, such as a lightning strike.

In some embodiments of the present invention, the meter 225 can be an automated reconnect/disconnect (RCDC) meter. The RCDC meter can be used to actuate (i.e. open or close) a switching element in the capacitor bank. For example, a control signal can be transmitted from a central station to the RCDC meter, or an auxiliary control circuit panel, causing the RCDC meter to actuate the switching element. The control signal can be transmitted to the RCDC meter via many means known in the art. In an exemplary embodiment of the present invention, the control signal is transmitted to the RCDC meter via an AMI system. In another exemplary embodiment of the present invention, the control signal is transmitted to the RCDC meter via a radio frequency signal.

Figure 3:
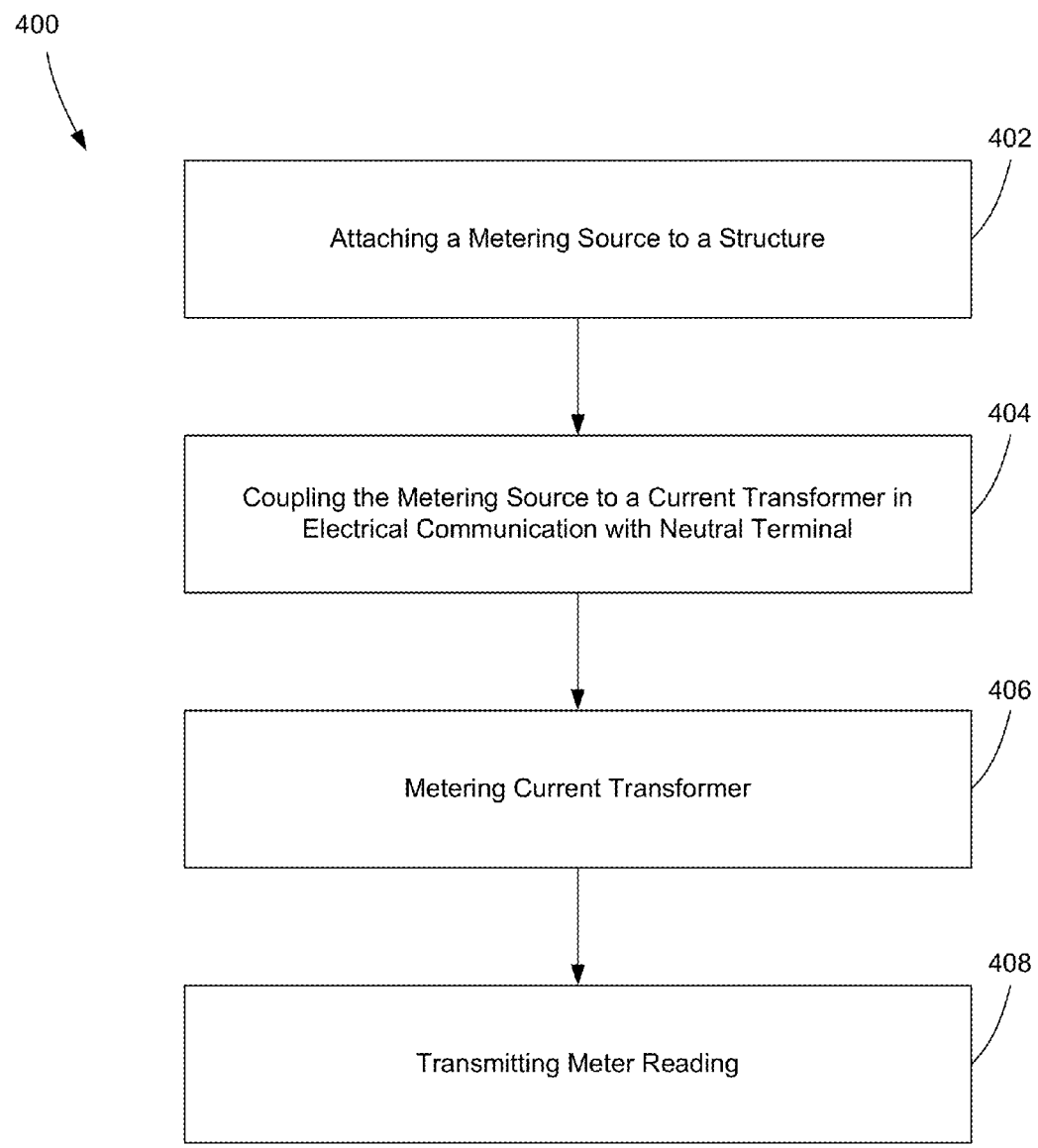
FIG. 3 illustrates a flow diagram of a method of monitoring, in accordance with an exemplary embodiment of the present invention.

In additions for capacitor bank monitoring systems, embodiments of the present invention provide methods of monitoring the status of a capacitor bank. Referring now to FIG. 3, a flow diagram of an exemplary method 400 of monitoring is illustrated. The method 400 is configured to meter and monitor the capacitor bank 135 in a power distribution system 100. The method 400 monitors a neutral terminal 140 on the power distribution system 100, which is in electrical communication with the capacitor bank 135.

At 402, the method 400 includes attaching a metering source to a structure. The structure can be a power pole, such that a utility meter—which is regularly attached to a dwelling to monitor the electricity used by the dwelling—is supported by a power pole. At 404, the method 400 further includes coupling the metering source to a current transformer. In addition, the metering source and current transformer can be coupled in electrical communication with the neutral terminal. At 406, the method also includes metering the reading of the current transformer from the neutral terminal. In other words, this metering includes obtaining metered data. In some embodiments, this metering can be conducted by the meter that is in part of the metering source. Then, at 408, the metered data can be transmitted. This metered data obtained by the meter can be transmitted in a wired or a wirelessly manner. For example, the metered data can be wirelessly transmitting meter readings to a remote location, via AMI or AMR technologies. The metered data can show whether a capacitor is failing or has failed.

Figure 4:
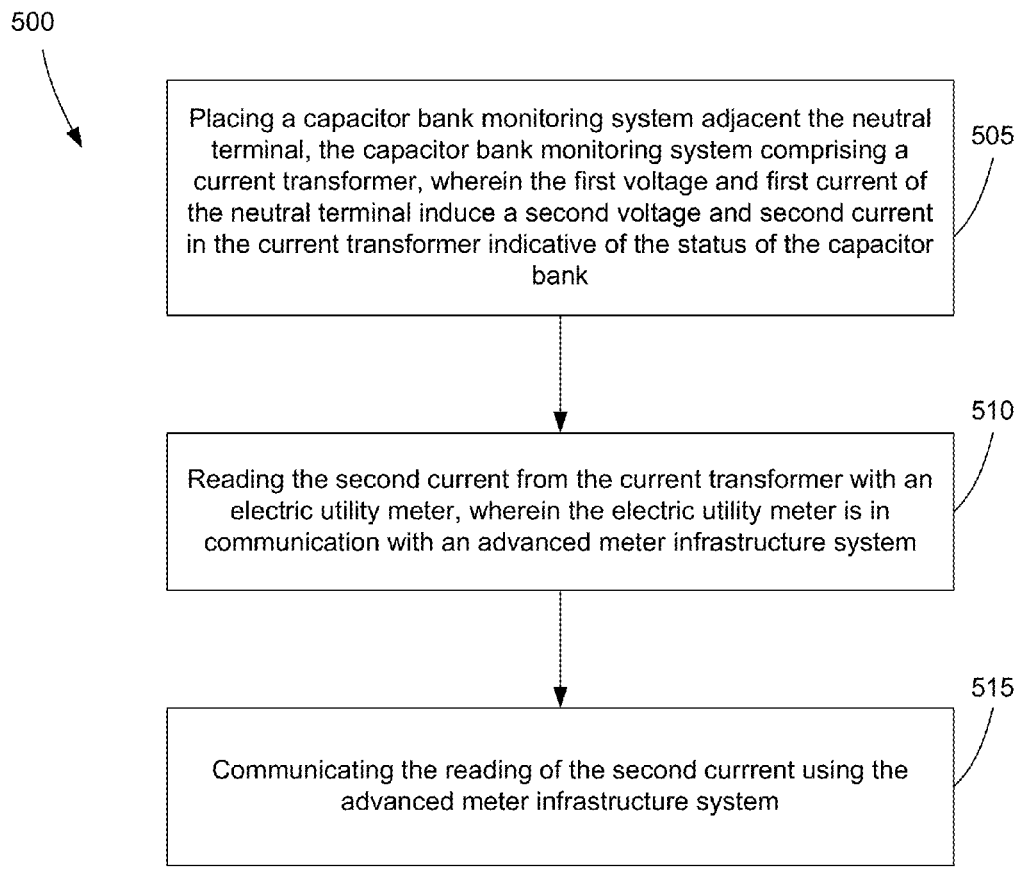
FIG. 4 illustrates a flow diagram of a method of monitoring a capacitor bank, in accordance with an exemplary embodiment of the present invention.

Referring now to FIG. 4, another exemplary method 500 of monitoring the status of a capacitor bank is illustrated. The method 500 comprises placing a capacitor bank monitoring system adjacent the neutral terminal from the capacitor bank 505, such that current is induced in the current transformer, reading the current from the current transformer with a utility meter 510, and communicating the reading to a central station using an AMI system 515. In some embodiments of the present invention, the method 500 further comprises actuating a switching element in the capacitor bank upon receiving a control signal. The control signal can be received from the central station. In some embodiments of the present invention, the control signal is received from the central station via an AMI system.

Some embodiments of the present invention are configured to adapt a meter designed for use as a residential electric meter, e.g., meeting ANSI C12.20 standards, to be adapted to monitor the neutral of a capacitor bank. ANSI C12.1 relates to most electricity meters, for example and not limitation Form 1S Two-wire 120 volt single phase, Form 2S Three-wire 240 single phase meter, and the like. The Three-wire 240 volt single phase meter is the type meter used on many residential services with up to a 200 Amp main customer circuit breaker. This may be also designated as a self-contained Class 200 meter. These are usually the lower cost, mass produced meters in the industry.

In some embodiments of the present invention, a Form 3S Two-wire 240 Volt single phase meter can be implemented as the meter in the capacitor monitoring system. While this meter is conventionally used on residential services, it is not necessarily typical. It may have a similar manufacturing cost to the more frequent Form 2S models.

Generally speaking, ANSI C12.20 applies to those meters which utilize N−1 measuring elements (for N conductors) with specific potential reference according to Blondel's Theorem to measure energy. This is the typical arrangement used for most multi-element (multi-stator) meters for poly phase services, which require more sophisticated measurement methods. These devices are built to higher accuracy standards and a separate standard was developed to address these some years ago.

The C12.20 standard does specify accuracy tables and performance for the new solid-state about 0.2/0.5% accuracy class meters and this standard has been referenced for new solid-state AMI residential use meters, Form 2S Class 200 (albeit incorrectly because this requires balanced load conditions to obtain these results). In exemplary embodiments of the present invention, the meter adapted for use in the capacitor monitoring system can demonstrate ANSI approximately 0.2% accuracy performance under balanced loading conditions.

Embodiments of the present invention have many advantages over conventional systems in addition to those previously discussed. For example, some embodiments of the present invention allow for the early discovery of one or more capacitors 130 in a capacitor bank 135 in poor health. Discovering a capacitor 130 is near its life end enables a utility to replace it (sooner than without monitoring) and thus reduce the loss of wasted electricity. Additionally, some embodiments of the present invention provide for the ability to place elements of the capacitor bank monitoring system 200 above a system neutral line and some elements below the system neutral. System neutral is the line above which only a trained lineman can make adjustments or improvements to the distribution system 100. Anyone, however, can work beneath the system neutral. In some embodiments of the present invention, some components of the monitoring system 200 can be placed above the system neutral, e.g., the connection to the neutral terminal, and thus can be implemented by a trained lineman. In certain situations, it may be desired to leave certain elements of the monitoring system 200 beneath the system neutral to allow others to access the monitoring system. For example and not limitation, the metering connection 220 can be placed beneath the system neutral to allow access by various metering systems and entities.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way. It is intended that the application is defined by the claims appended hereto.

What is claimed is:

1. A capacitor bank monitoring system for monitoring a status of a capacitor bank in an electrical power distribution subsystem, the capacitor bank including at least one capacitor in serial electrical communication with a fuse element, the capacitor bank in electrical communication with a neutral terminal of the power distribution system, the capacitor bank monitoring system comprising:
   a housing for an electric utility meter;
   a current transformer in proximity to the housing and measuring the current carried by the neutral terminal, the current indicative of a status of the capacitor bank; and
   a meter connection subsystem providing electrical communication between the current transformer and the electric utility meter,
   wherein the electric utility meter communicates the status of the of the capacitor bank.

2. The capacitor bank monitoring system of claim 1, wherein the electric utility meter communicates the status of the capacitor bank to a central station via an advanced meter infrastructure system.

3. The capacitor bank monitoring system of claim 1, wherein the meter connection subsystem comprises a plurality of conductive receiving elements that receive apertures of the electric utility meter.

4. The capacitor bank monitoring system of claim 1, wherein the housing comprises a securing element for securing the capacitor bank monitoring system to a support structure.

5. The capacitor bank monitoring system of claim 4, wherein the securing element is a non-boring securing element securing the capacitor bank monitoring system to a support structure without boring into the support structure.

6. The capacitor bank monitoring system of claim 1, wherein the electric utility meter is an automated reconnect/disconnect utility meter configured to actuate a switching element of the capacitor bank upon reception of a control signal.

7. The capacitor bank monitoring system of claim 6, further comprising an auxiliary control circuit panel in electrical communication with the automated reconnect/disconnect utility meter for controlling at least a portion of the capacitor bank.

8. A method of monitoring the status of a capacitor bank in an electrical power distribution system, the capacitor bank comprising a capacitor and a fuse element in serial electrical communication, wherein the capacitor bank is in electrical communication with a neutral terminal carrying a first voltage and first current, the method comprising:
   placing a capacitor bank monitoring system adjacent the neutral terminal, the capacitor bank monitoring system comprising a current transformer;
   inducing a second voltage and a second current in the current transformer from the first voltage and first current, the second voltage and second current indicative of the status of the capacitor bank;
   reading the second current from the current transformer with an electric utility meter, wherein the electric utility meter is in communication with an advanced meter infrastructure system; and
   communicating the reading of the second current using the advanced meter infrastructure system.

9. The method of claim 8 further comprising:
   housing the electric utility meter in proximity to the current transformer; and
   providing electrical communication between the current transformer and the electric utility meter via a meter connection subsystem.

10. The method of claim 9, wherein the meter connection subsystem comprises a plurality of conductive receiving elements configured to receive members of the utility meter.

11. The method of claim 9, wherein the step of housing comprises securing the capacitor bank monitoring system to a support structure.

12. The method of claim 11, wherein the step of securing comprises non-boringly securing the capacitor bank monitoring system to the support structure without boring into the support structure.

13. The method of claim 8, further comprising actuating a switching element of the capacitor bank upon reception of a control signal.

14. The method of claim 13, wherein the step of actuating comprises using an electric utility meter.

15. The method of claim 14, wherein the step of actuating comprises using an automated reconnect/disconnect electric utility meter.

16. The method of claim 15, further comprising controlling at least a portion of the capacitor bank with an auxiliary control circuit panel in electrical communication with the automated reconnect/disconnect electric utility meter.

17. A capacitor bank monitoring system for monitoring a health of a capacitor bank in an electrical power distribution subsystem, the capacitor bank comprising at least one capacitor and fuse element in serial electrical communication, the capacitor bank in electrical communication with a neutral terminal of the power distribution system, the capacitor bank monitoring system comprising:
   a housing sized to receive and secure an electric utility meter;
   a current transformer positioned about the housing and configured to measure the current passing through the neutral terminal, the current indicative of the health of the capacitor bank; and
   a meter connection subsystem positioned to provide electrical communication between the current transformer and the utility meter,
   wherein the utility meter is configured to communicate the health of the of the capacitor bank to a central station.

18. The capacitor bank monitoring system of claim 17, wherein the utility meter is configured to communicate the health of the capacitor bank to a central station via an advanced meter infrastructure system.

19. The capacitor bank monitoring system of claim 17, wherein the meter connection subsystem comprises a plurality of conductive receiving elements configured to receive apertures of the utility meter such that the utility meter and the current transformer are in electrical communication with each other.

20. The capacitor bank monitoring system of claim 17, wherein the housing comprises a non-boring securing element for securing the capacitor bank monitoring system to a support structure without boring into the support structure.

21. The capacitor bank monitoring system of claim 17, wherein the capacitor bank further comprising a switching element in serial electrical communication with the capacitor and the fuse element, wherein the utility meter is an automated reconnect/disconnect utility meter configured to actuate the switching element upon reception of a control signal.

* * * * *